US012603649B2

(12) United States Patent
Lu et al.

(10) Patent No.: US 12,603,649 B2
(45) Date of Patent: Apr. 14, 2026

(54) FAULT CURRENT BYPASS BASED SOLID STATE CIRCUIT BREAKERS AND ACTIVE CLAMPING SNUBBERS FOR DC CIRCUIT BREAKERS

(71) Applicant: Drexel University, Philadelphia, PA (US)

(72) Inventors: Fei Lu, Wynnewood, PA (US); Hua Zhang, Philadelphia, PA (US); Reza Kheirollahi, Philadelphia, PA (US)

( * ) Notice: Subject to any disclaimer, the term of this patent is extended or adjusted under 35 U.S.C. 154(b) by 0 days.

(21) Appl. No.: 18/058,440

(22) Filed: Nov. 23, 2022

(65) Prior Publication Data

US 2023/0170901 A1      Jun. 1, 2023

Related U.S. Application Data

(60) Provisional application No. 63/282,374, filed on Nov. 23, 2021.

(51) Int. Cl.
*H03K 17/73* (2006.01)
(52) U.S. Cl.
CPC .................................. *H03K 17/73* (2013.01)
(58) Field of Classification Search
None
See application file for complete search history.

(56) References Cited

U.S. PATENT DOCUMENTS

| | | | | |
|---|---|---|---|---|
| 4,288,732 | A | * | 9/1981 | Wilson ...................... H02P 1/46 318/807 |
| 4,849,873 | A | * | 7/1989 | Vanderhelst ........ H02M 7/5387 363/136 |
| 6,104,106 | A | * | 8/2000 | Partridge ......... H03K 17/08144 307/130 |
| 6,900,557 | B1 | * | 5/2005 | Gaudreau ............ H03K 17/102 332/134 |
| 9,184,003 | B2 | * | 11/2015 | Crane ................... H01H 33/596 |
| 9,373,473 | B2 | * | 6/2016 | Dupraz .................. H01H 9/548 |
| 10,770,883 | B2 | * | 9/2020 | Creech ................... H02H 3/087 |
| 11,038,338 | B2 | * | 6/2021 | Wen .......................... H02J 1/00 |
| 2020/0028359 | A1 | * | 1/2020 | Garbi .............. H03K 17/08148 |
| 2021/0288636 | A1 | * | 9/2021 | Song .................... H03K 17/082 |
| 2022/0149613 | A1 | * | 5/2022 | Hänsel .................. H02M 7/219 |
| 2022/0149615 | A1 | * | 5/2022 | Song .................... H03K 17/731 |

* cited by examiner

*Primary Examiner* — Menatoallah Youssef
*Assistant Examiner* — Khareem E Almo
(74) *Attorney, Agent, or Firm* — Schott, P.C.

(57) ABSTRACT

A thyristor-based dc solid state circuit breaker (SSCB) named Y-type includes a new complementary commutation circuit including a capacitor-capacitor pair, which features three advantages. First, a fast commutation is achieved using a countercurrent pulse injection by the capacitor-capacitor pair structure. Second, metal-oxide varistors (MOVs) are disconnected from the power line when SSCB is OFF, which solves the reliability issue due to the MOV degradation and enhances the voltage utilization rate of the main switch. Third, benefiting from the capacitor-capacitor pair structure, reliable reclosing and rebreaking are obtained for practical applications.

9 Claims, 21 Drawing Sheets

Proposed Y-SSCB in a typical dc system

Proposed Y-SSCB in a typical dc system

Mode II *($t_e \leq t < t_1$)*: Reclosing process

Mode IV *($t_2 \leq t < t_3$)*: Short circuit fault occurs in the system.

Mode I *($t_1 < t_2$)*: SSCB is OFF

Mode III *($t_1 \leq t < t_2$)*: Normal operation mode

Mode V *(t=t₃)*: $S_a$ turns on to achieve current commutation in $S_M$

Mode VI *(t₃≤t<t₅)*: Fault current commutates to $S_a$; $i_{Sa}=i_f$ and $i_{Sm}=0$

Mode VII *(t₅≤t<t₆)*: Fault current reduces to $V_{C1}/R_1$; $S_a$ enters OFF-mode

Mode VIII *(t₆≤t<t₁)*: $S_a$ turns off naturally; $C_1$ discharges on $R_1$; interruption completes Bi-directional SSCB in [27]

Proposed Bi-directional Y-type SSCB

Table I
Voltage and current stress on circuit components

| Cmp. | $S_m$ ($S_a$) | $C_1$ ($C_2$) | $R_1$ ($R_2$) | $D_1$($D_2$) | $MOV_1$ |
|---|---|---|---|---|---|
| $V_{Peak}$ | $V_{Clmp}$ ($V_{dc}$) | $V_{Clmp}$ ($V_{dc}$) | $V_{Clmp}$ ($V_{dc}$) | $V_{dc}$ ($V_{dc}$) | $V_{Clmp}$ |
| $i_{Peak}^{(2)}$ | $I_f$($I_p^{(3)}$) | $I_p$($I_p$) | $V_{Clmp}$/$R_1$($V_{dc}$/$R_2$) | $I_f$($V_{dc}$/$R_2$) | $I_f$ |

(1) Transient voltage; (2) Transient current; (3) $I_p$=$I_f$+$I_{RM}$) which lasts for a few microseconds. $V_{Clmp}$ is the maximum clamping voltage of $MOV_1$

FIG. 17

Table II
Quantitative comparison with the SSCB in [[27]]

| | SSCB | #Thyr. | #Cap. | #Res. | #MOV | #Diode |
|---|---|---|---|---|---|---|
| Unidirectional | [27] | 2 | 1 | 1 | 1 | 0 |
| | Y-SSCB | 2 | 2 | 2 | 1 | 2 |
| Bidirectional | [27] | 4 | 2 | 2 | 1 | 0 |
| | Y-SSCB | 4 | 2 | 3 | 2 | 5 |

FIG. 18

Table III
Parameters of Y-SSCB prototype and DC test system

| Parameter | Value | Parameter | Value |
|---|---|---|---|
| $V_{dc}$ | 400 V | $L_{Line}$ | 3.2 mH |
| $R_L$ | 50 Ω | $S_m$ and ($S_a$) | SK655KD |
| $D_1$ | C4D20120D | $C_1$ and ($C_2$) | 45 μF |
| $R_1$, $R_s$, $R_2$ | 2.5 kΩ, 0.33 Ω, 50 Ω | MOV | V320LA40BP |

FIG. 19

Table IV
Comparison with the thyristor-based SSCBS in terms of
preparation time and reclosing time intervals

| SSCBs | Y-SSCB | [27][(1)] | [25][(2)] | [20][(1)] | [37][(4)] |
|---|---|---|---|---|---|
| Re-closing time interval | 337.5 ms | 168.75 ms | N/A | 30 ms | 180 ms |
| Preparation time interval | 6.75 ms | 168.75 ms | 28 µs | 30 ms | Zero |

(1) For R=2.5 kΩ and C=22.5 µF, the reclosing time has been calculated for the fault resistance of $R_f$=0 Ω, where it is higher for larger $R_f$ or under load interruption process. (2) The dc bus voltage remains on the capacitor during the SSCB OFF-state; the preparation time has been calculated for R=0.25 Ω and C=37.5 µF. (3) for $R_1$=$R_2$=100 Ω and C=50 µF. (4) for R=1 kΩ and C=60 µF

FIG. 20

Table V

Comprehensive comparative study including active and passive commutations

| Thyristor-based SSCBs | Active Commutation | | | | | | Passive Commutation | | | | |
|---|---|---|---|---|---|---|---|---|---|---|---|
| | | CC-based | AR-based | | | LCS-based | | Z-Source | Coupled-Ind. | F-Source | H-type | T-type |
| Parameters | Y[1] | [27] | [20] | [21] | [24] | [25] | [26] | [10] | [14] | [15] | [16] | [17] |
| Number of Capacitor | 2 | 1 | 1 | 1 | 1 | 1 | 2 | 1 | 1 | 1 | 2 | 1 |
| Number of Inductor | 0 | 0 | 1 | 1 | 2 | 0 | 0 | 2 | 2 | 2 | 2 | 2 |
| Number of Diode | 2 | 0 | 1 | 1 | 2 | 0 | 2 | 2 | 2 | 1 | 0 | 0 |
| Number of Resistor | 2 | 1 | 2 | 2 | 1 | 1 | 0 | 2 | 2 | 1 | 0 | 0 |
| Number of Thyristor | 2 | 2 | 3 | 3 | 2 | 1 | 1 | 1 | 1 | 1 | 1 | 1 |
| Number of IGBTs | 0 | 0 | 0 | 0 | 0 | 1 | 2 | 0 | 0 | 0 | 0 | 0 |
| Commutation[2] | Fast | Fast | Slow | Slow | Fast | Fast | Fast | Fast | Fast | Fast | Fast | Fast |
| Autonomous | ✓ | * | * | * | * | * | * | ✓ | ✓ | ✓ | ✓ | ✓ |
| Adjustable[3] | ✓ | * | * | * | ✓ | * | * | * | * | * | * | * |
| Manual Trip | ✓ | ✓ | ✓ | ✓ | ✓ | ✓ | ✓ | ✓ | ✓ | ✓ | ✓ | ✓ |
| Solve MOV Degradation | ✓ | ✓ | N/A | N/A | N/A | * | * | N/A | N/A | N/A | N/A | N/A |
| Isolate source from faults[4] | * | * | * | ✓ | ✓ | * | * | * | ✓ | ✓ | * | ✓ |
| Re-closing and re-breaking | ** | * | ** | ** | ** | ** | ** | ** | * | ** | * | ** |
| Current Capability[5] | ** | ** | ** | ** | * | * | * | ** | * | * | * | * |

(1) Proposed Y-SSCB. (2) Current commutation based on high frequency capacitive path is regarded as a fast. (3) Tuning initial voltage on the injection capacitor. (4) The breaker isolates the source from the fault after turning the main switch off. (5) limited by inductors or full control switches such as IGBTs in main branch

FIG. 21

FAULT CURRENT BYPASS BASED SOLID STATE CIRCUIT BREAKERS AND ACTIVE CLAMPING SNUBBERS FOR DC CIRCUIT BREAKERS

STATEMENT REGARDING GOVERNMENT SUPPORT

This invention was made with government support under Contract No. DE-AR0001414 awarded by the Advanced Research Projects Agency-Energy (ARPA-E), U.S. Department of Energy. The government has certain rights in the invention.

BACKGROUND

I. Introduction

DC SOLID-STATE circuit breakers (SSCBs) present fast operation in response to low inertia of dc systems. Insulated-gate bipolar transistor (IGBT) based SSCBs present simple, fast, and compact topologies, but they suffer from high conduction losses. Newly introduced wide bandgap devices have led to remarkable advancements in SSCBs, yet high design cost is a big challenge.

Thyristors are used in SSCBs to realize high power capability and efficiency. Thyristors are inexpensive and commercially available. Current commutation strategies in thyristor-based SSCBs classify them into passive and active.

In passive commutation, the fault current in a thyristor is forced to zero by providing a high-frequency path through capacitors or coupled inductors. Z-source coupled inductor based, Γ-source, H-bridge type, and T-source breakers fall into this category.

Passive commutation SSCBs propose fast protection. They are autonomous and need no detection; also, the number of thyristors is limited. However, lack of overload protection is the challenge in the advanced system-level protections.

Manual tripping may be added by external components, but the final topologies are costly and complicated. Active communications are classified in three groups: active resonance (AR) presented in FIGS. 1(a) and 1(b), load-commutation switch (LCS) indicated in FIG. 1(c), and complementary commutation (CC) shown in FIG. 1(d).

In an AR-based SSCB, an injection current is generated by the inductor and capacitor resonance. The resonant current is injected directly or through a coupled inductor. AR topologies can obtain complete protection during overload and short-circuit scenarios. But a large number of thyristors, inductors, and capacitors increase the system complexity and lower its power density.

In LCS-based SSCBs, IGBTs are connected in series with main thyristors. During dc current breaking, IGBTs force fault currents to auxiliary capacitive circuits, having been previously developed in hybrid breakers. That is, by turning IGBT OFF, the thyristor's current reduces below its holding value, and a metal-oxide varistor (MOV) holds the voltage across the IGBT. LCS-based SSCBs obtain complete protection; they require no charging circuits and leverage the benefits of IGBTs. But IGBTs impact efficiency and current capability.

CC-based SSCBs benefit from class-D or CC. Energy stored in a precharge capacitor is used to achieve commutation in thyristors. The capacitor is selected in a way that thyristors undergo a complete forward blocking. Others have presented three different breakers based on CC topology targeting ac systems. Similarly, J. Shu, J. Ma, S. Wang, Y. Dong, T. Liu, and Z. He, "A newactive thyristor based DCCB with reliable opening process," IEEE Trans. Power Electron., vol. 36, no. 4, pp. 3617-3621, April 2021 (ref. no. 27 in figures) herein incorporated by reference as if fully set forth herein have proposed a dc breaker upon CC; the topology is simple with a low number of active and passive components. As only thyristors are in the main branch, high power ratings are easily achieved. Nevertheless, the breaker in may face low reliability during reclosing and does not satisfy IEC-62271-10. The mentioned difficulty is elaborated in Sections II and IV below.

SUMMARY OF THE EMBODIMENTS

This device described herein aims to overcome this problems above by introducing a new Y-type SSCB (Y-SSCB). The proposed Y-SSCB comes before the line inductor in dc systems with the same configuration in Shu noted above. The device herein solves the problem at least as follows.

1) The SSCB benefits from an ultrafast countercurrent pulse injection by a capacitor-capacitor pair to implement a complete commutation while achieving a fast operation.
2) MOVs protect thyristors and capacitors from voltage overshoot, yet MOVs are disconnected from the power line when SSCB is OFF to solve MOVs safety issues. In this case, no mechanical disconnector is needed, which maximizes the compactness and enhances the lifetime.
3) Preparation time between a reclosing and the following rebreaking is minimized to enhance reliability while it guarantees an effective short-circuit fault isolation.

(Rs×If)–vC2. The circuit turn-OFF time tcc for Sm shows 57.7 µs, which is sufficient for the selected thyristor. Voltage on C1 is clamped to 740 V and C2 is prevented to be reversely charged.

Figure 14:
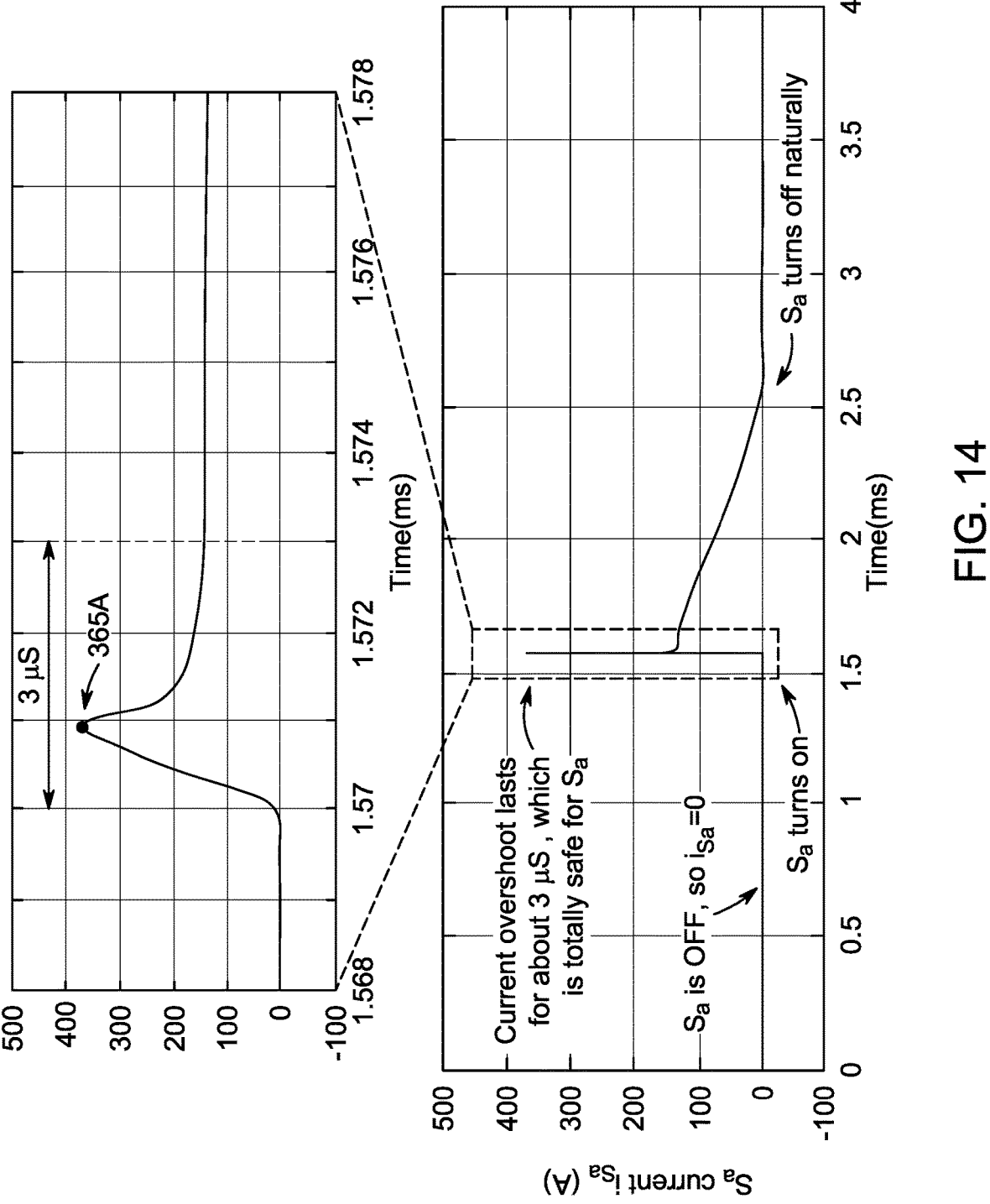

FIG. 14 shows experimental results: Sa current iSa during dc current interruption.

Figure 15:
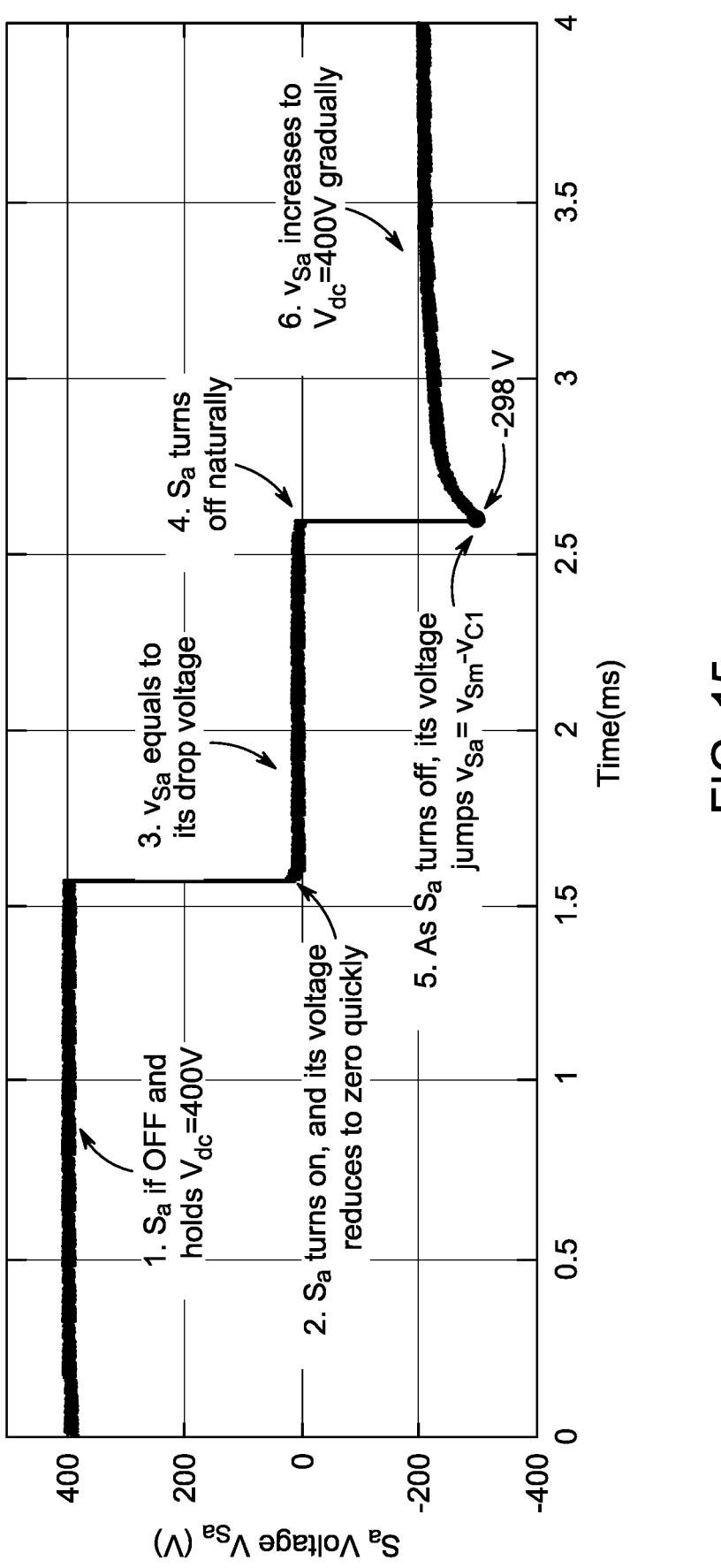

FIG. 15 shows experimental results: Sa voltage vSa during dc current interruption.

Figure 16:
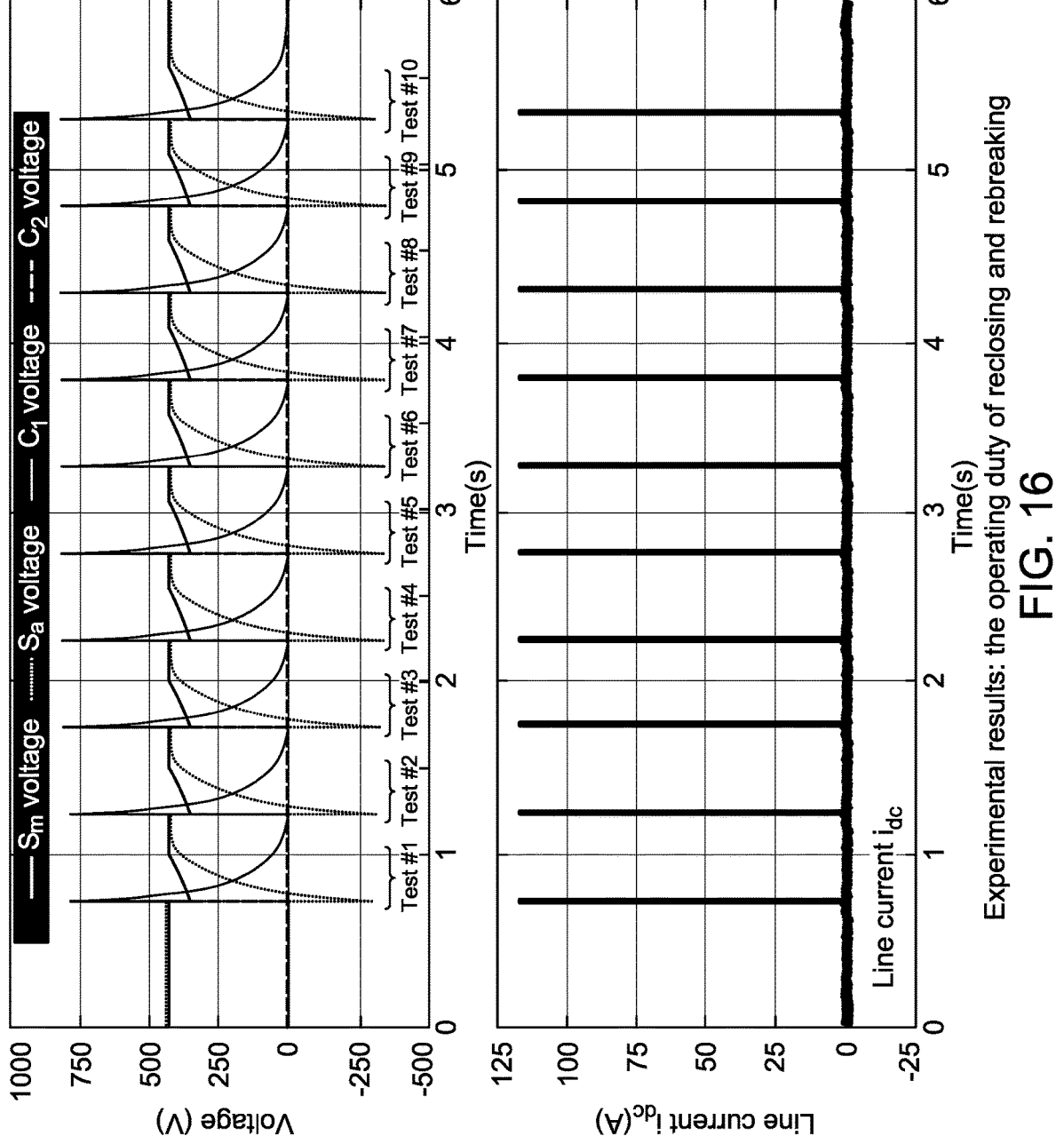

FIG. 16 shows experimental results: the operating duty of reclosing and rebreaking.

FIG. 17 shows Table 1.

FIG. 18 shows Table 2.

FIG. 19 shows Table 3.

FIG. 20 shows Table 4.

FIG. 21 shows Table 5.

DETAILED DESCRIPTION OF THE EMBODIMENTS

Figure 1A:
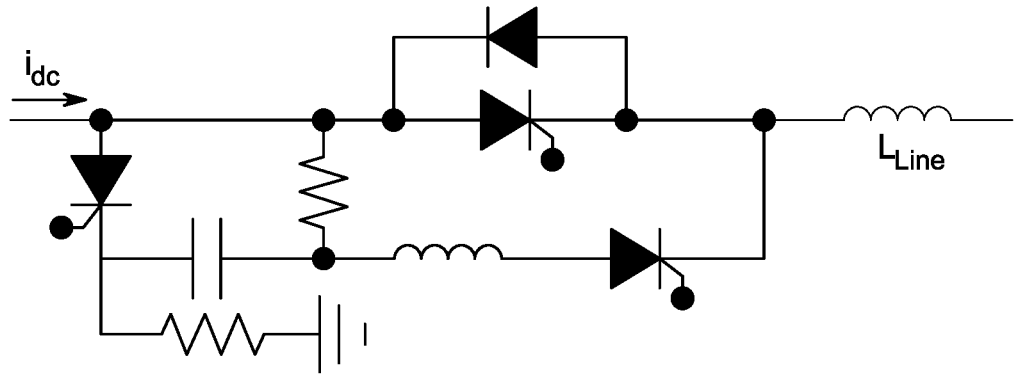
FIGS. 1(a) to 1(d) show active thyristor-based SSCBs: active resonance (AR) presented in FIGS. 1(a) and 1(b), load-commutation switch (LCS) indicated in FIG. 1(c), and complementary commutation (CC) shown in FIG. 1(d).
Figure 1B:
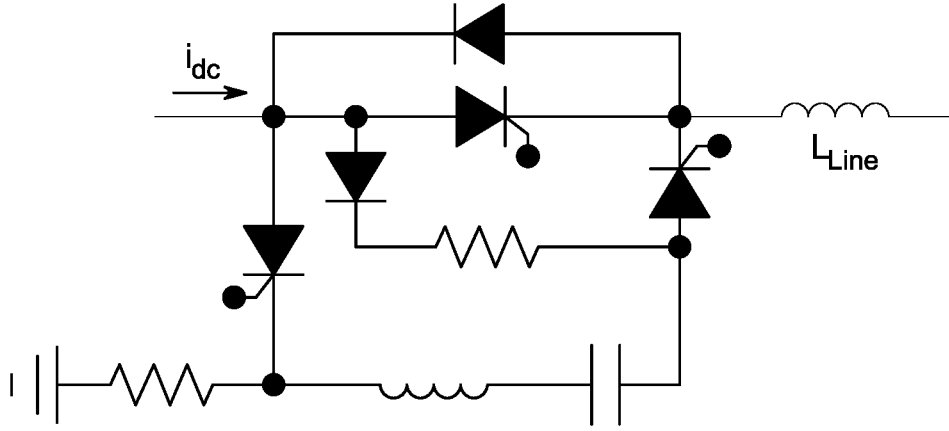
Figure 1C:
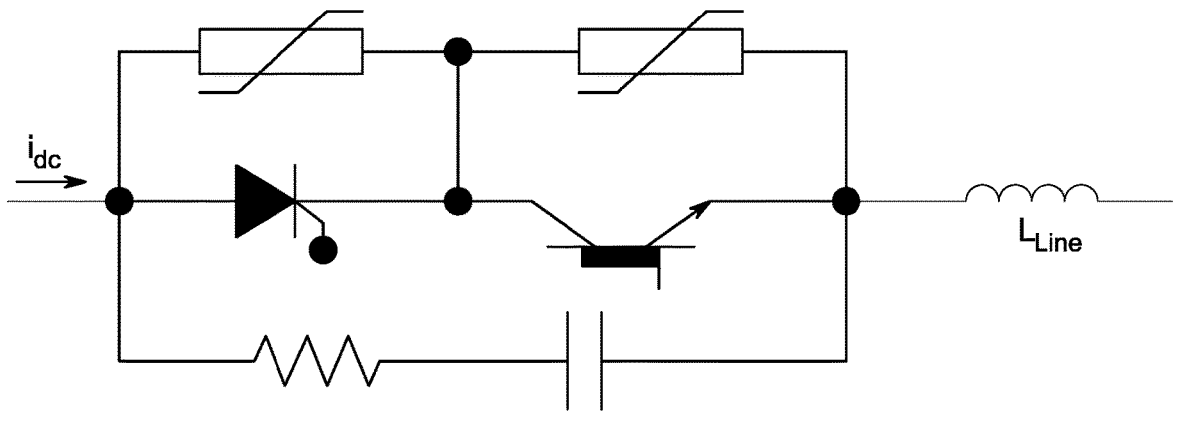
Figure 1D:
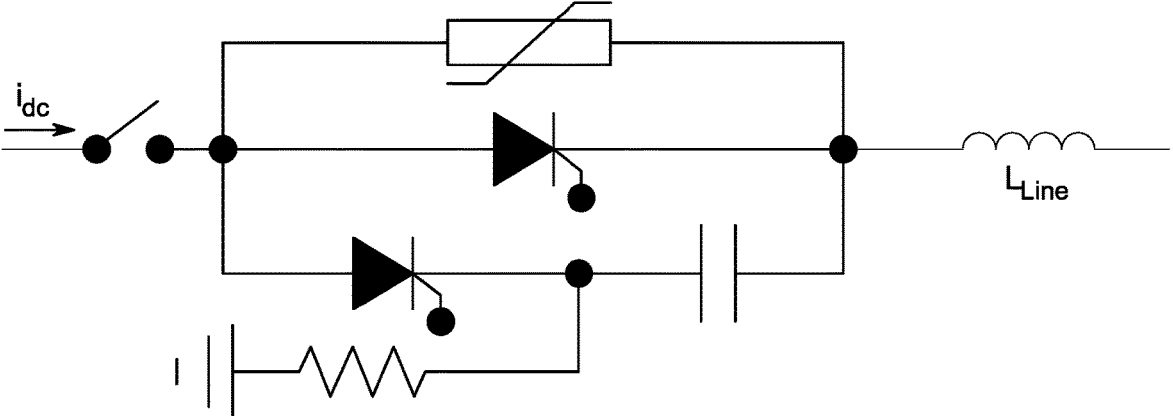
Figure 2:
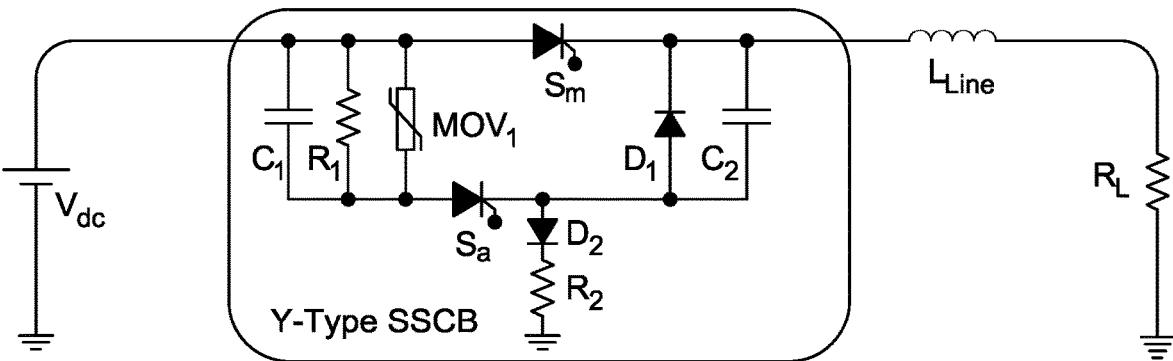
FIG. 2 shows the Y-SSCB in a typical dc system.

II. Capacitor-Capacitor Pair Concept in Y-SSCB: Achieving Reliability During Reclosing A. Proposed Y-SSCB FIG. 2 shows the Y-SSCB in a typical dc system. The proposed Y-SSCB benefits from a capacitor-capacitor (C1-C2) pair, which may have two functions. First, C2 is charged by the dc system, and its energy obtains a CC in Sm during dc current interruption. Second, C1 helps to achieve a natural turn-OFF in Sa. In addition to performing a fast fault current isolation, the Y-SSCB can operate under the operating duty of reclosing and rebreaking. In this case, C1-C2 pair presents higher reliability compared with the single capacitor used in Shu and justifies the effectiveness of the SSCB in practice. This is further elaborated in Section II-C.

B. Main Thyristor Turn-Off Dynamic in CC-Based SSCBs

Thyristor turn-OFF dynamic in CC-based SSCBs is analyzed in this section for two reasons. First, the parameters impacting the forward blocking in the main thyristor Sm are reviewed. Second, transient voltage and current values imposed on the main thyristor Sm and auxiliary thyristor Sa are studied.

Figure 3:
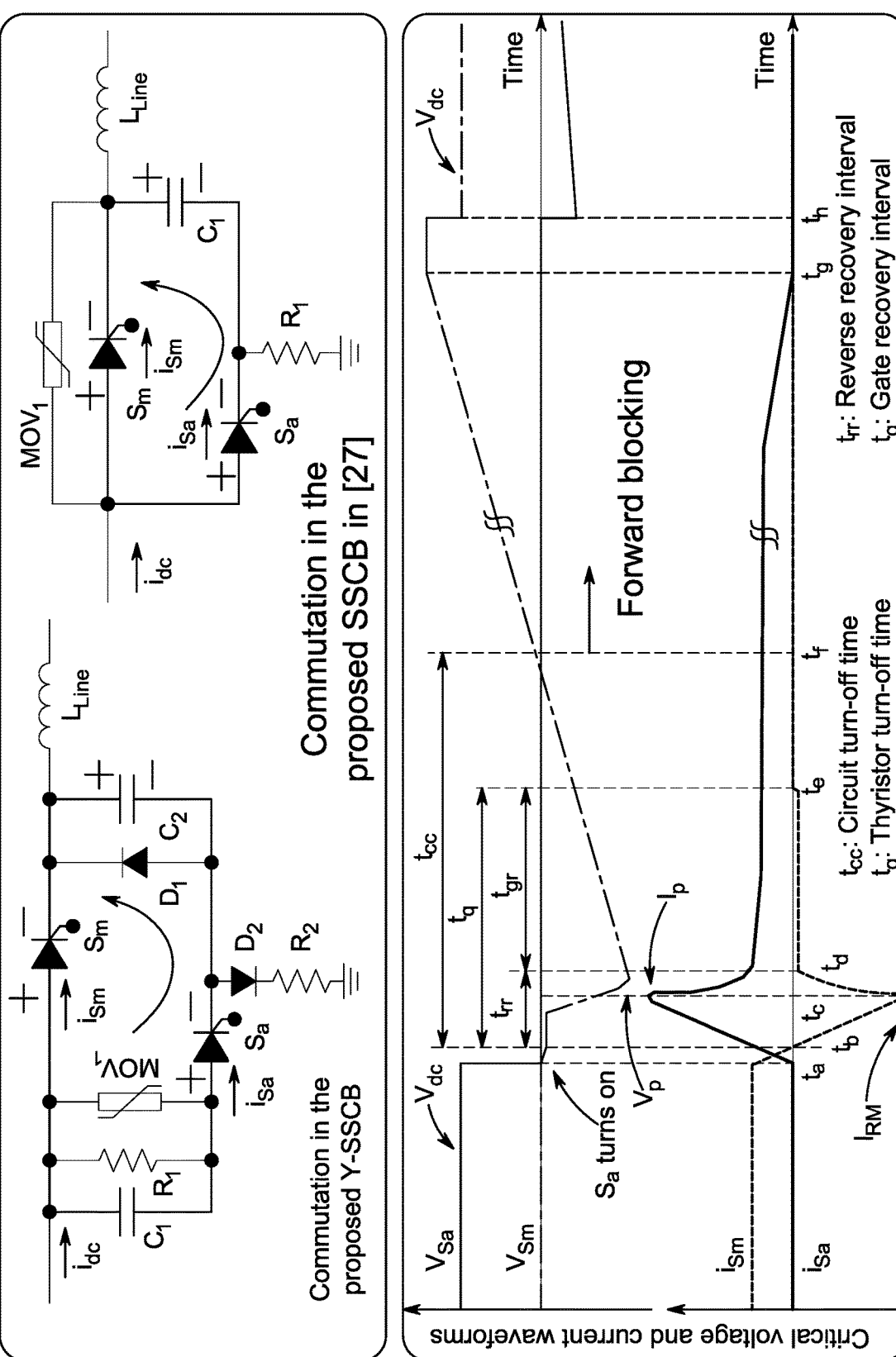
FIG. 3 shows the proposed Y-SSCB and the SSCB during the current commutation.

FIG. 3 shows the proposed Y-SSCB and the SSCB in Shu during the current commutation; also, critical waveforms are shown. The commutation process is almost the same for both SSCBs, but Sa turn-OFF and reclosing scenarios are different and explained in Section II-C.

Before t=ta, Sm is ON and conducts Idc; Sa is OFF (vSa=Vdc).

Interval ta≤t<tb: Sa turns ON at t=ta to obtain commutation in Sm. iSa starts rising, and iSm begins decaying at the same time.

Interval tb≤t<tc: At t=tb, iSm=0. Then, iSm continues to be negative due to carriers stored in semiconductor layers of Sm.

Interval tc≤t<td: iSm=IRM at t=tc, where about 60% of stored charges are swept away from outer junctions of Sm; iSa reaches the peak value of |Ip|=|IRM|+|Idc|. IRM is device dependent and circuit-dependent, and it can be described as follows:

$$IRM = f(Vdc, Idc, Ls, Rs, QRR, \Delta tbd) \qquad (EQ. 1)$$

where Ls and Rs are parasitic inductance and resistance in the current commutation loop, respectively; QRR is the recovered charge in Sm layers; and Δtbd=td–tb. As the density of carriers around outer layers of Sm decreases, iSm begins to return to zero.

Also, as shown in FIG. 3, vSm undergoes an undershoot to Vp. of Sm are removed, and these junctions start to block the negative voltage; in this case, iSm is close to zero. Time interval trr=td–tb is defined as reverse recovery time. However, carriers in the inner junction have no way to external circuits. These trapped carriers are decaying only by recombination, which needs a negative voltage across Sm. The time period tgr=te–td stands for the gate recovery time in which recombination completes.

Sm regains its forward blocking capability if reverse recovery and recombination are complete in order. So, thyristor turn-OFF time is tq=trr+tgr. In practice, vSm is designed to be negative for t tcc, where tcc=tf–tb; tcc and tq are labeled in FIG. 3.

C. Sa Turn-Off Process, Reclosing Under Reliability

Both capacitor-capacitor pair structure and single capacitor can achieve a complete commutation in Sm; however, SSCB in Shu suffers from low reliability during reclosing and leaves the system without any protection for a considerable period.

Figure 4:
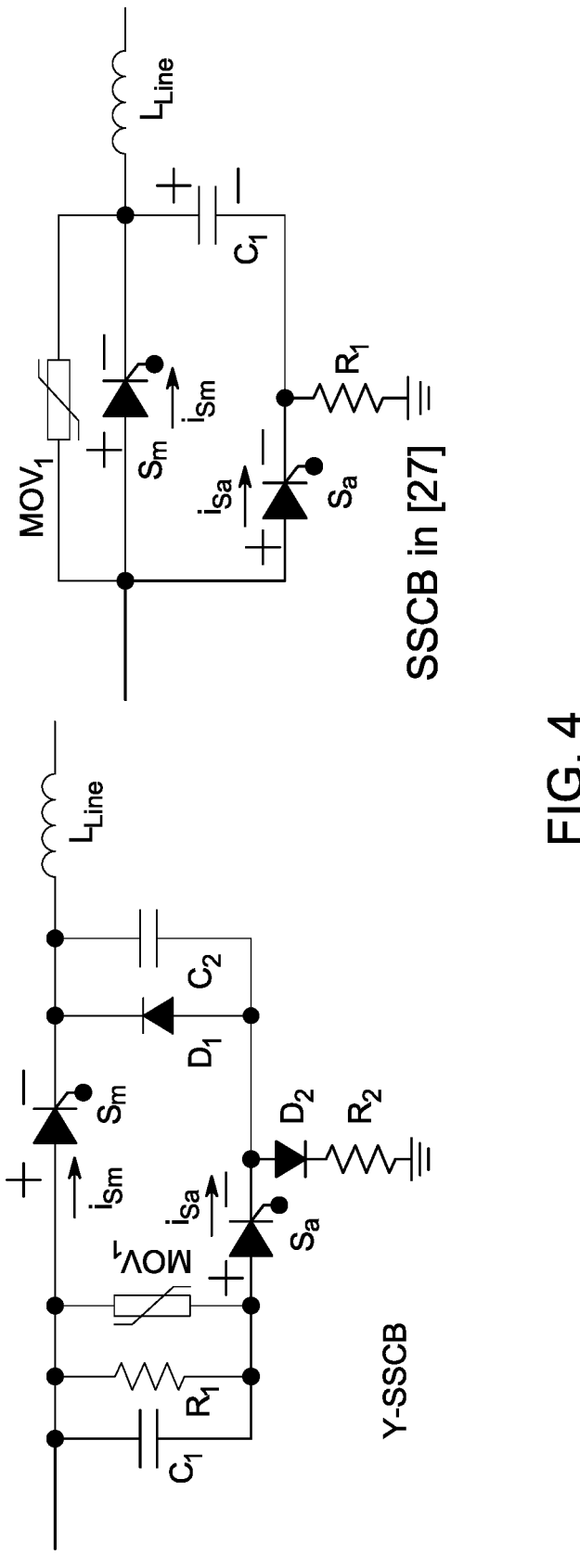
FIG. 4 shows Sa turn-OFF process in the proposed Y-SSCB and the breaker in the prior art.

FIG. 4 shows Sa turn-OFF process in the proposed Y-SSCB and the breaker in Shu. In the proposed Y-SSCB, C1 primarily helps to turn Sa OFF, and resistor R2 does not need to contribute to this process. In contrast, for the SSCB in Shu, R1 needs to reduce Sa current below its holding current (IH), meaning iSa=Vdc/R1<IH. In this case, R1 is in the range of hundreds of kΩ.

Figure 5:
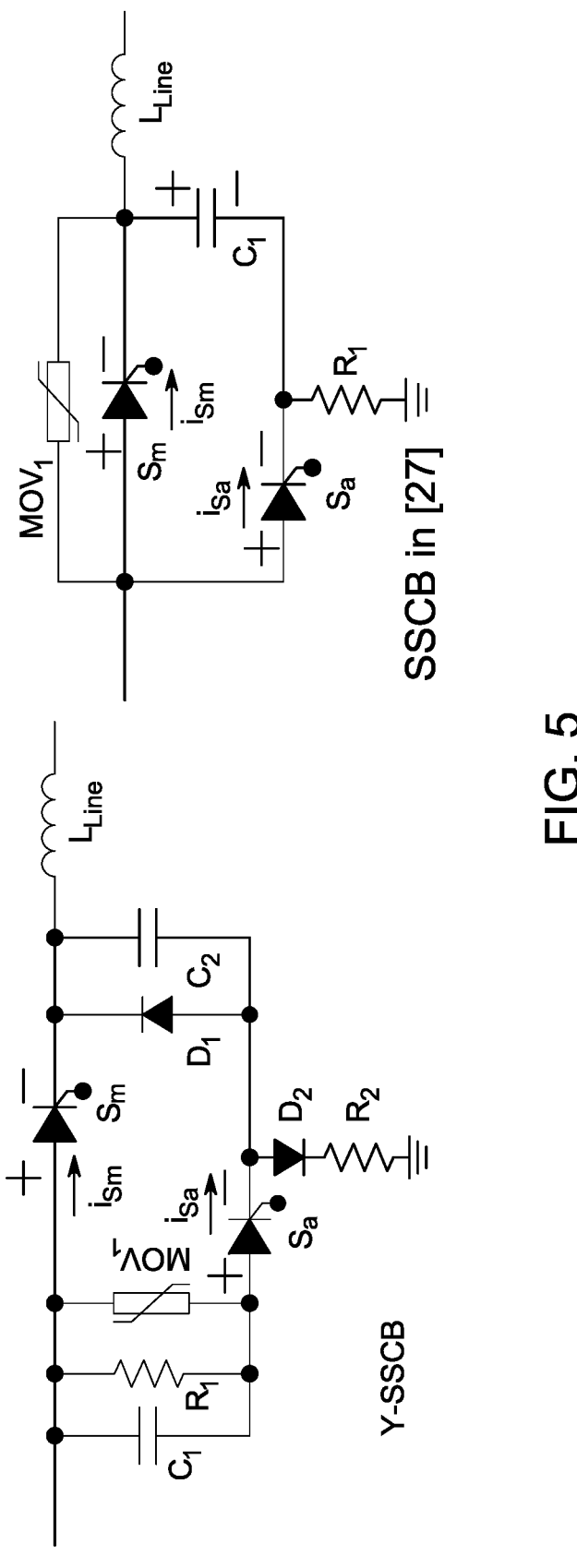
FIG. 5 shows the reclosing process in the proposed Y-SSCB and breaker in Shu.
Figure 6A:
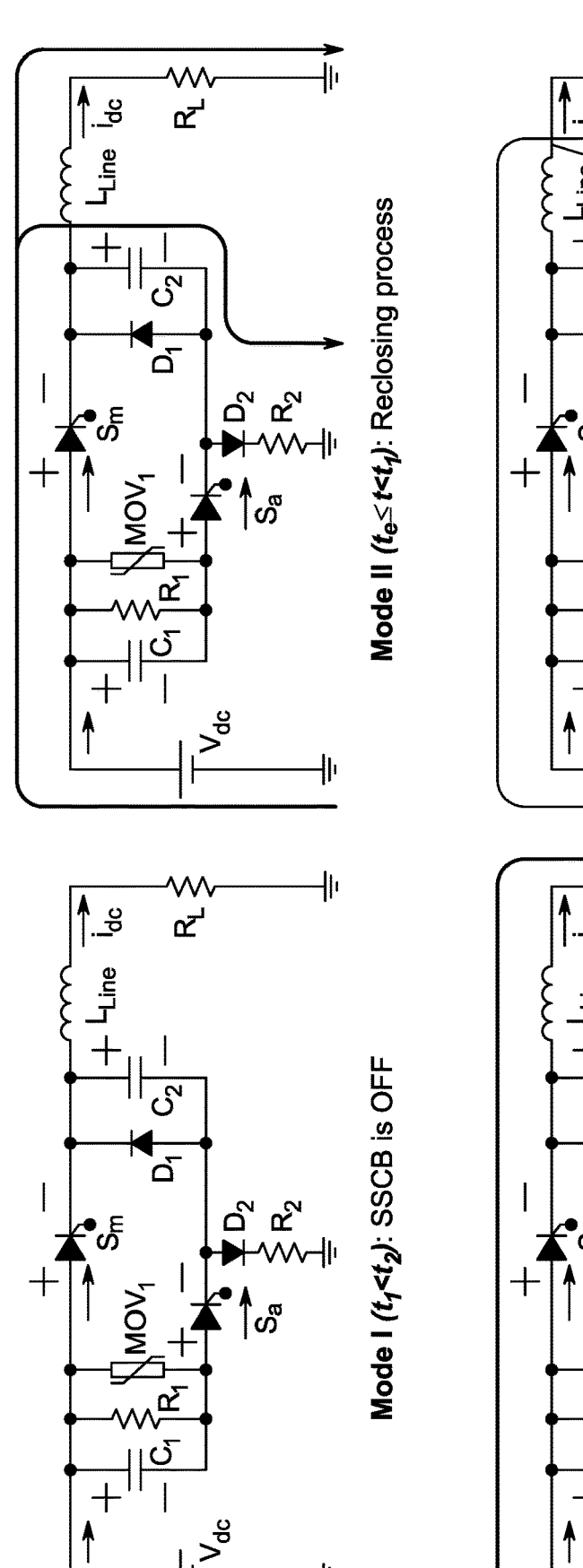
FIG. 6 shows 8 operating modes of the proposed Y-SSCB during a short-circuit fault current interruption.
Figure 6A:
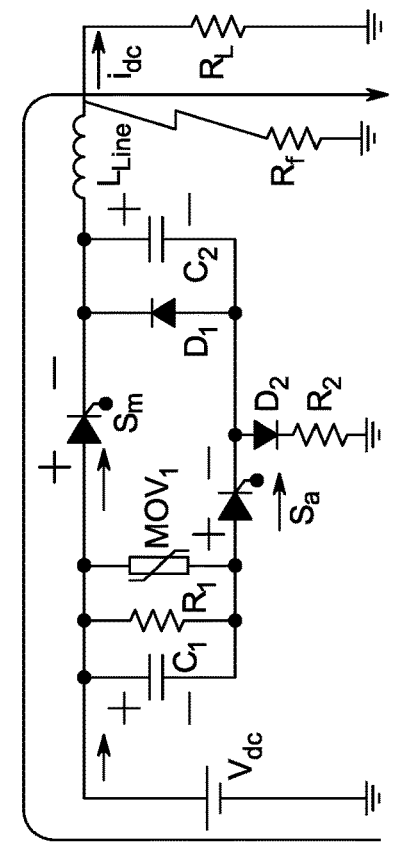
Figure 6A:
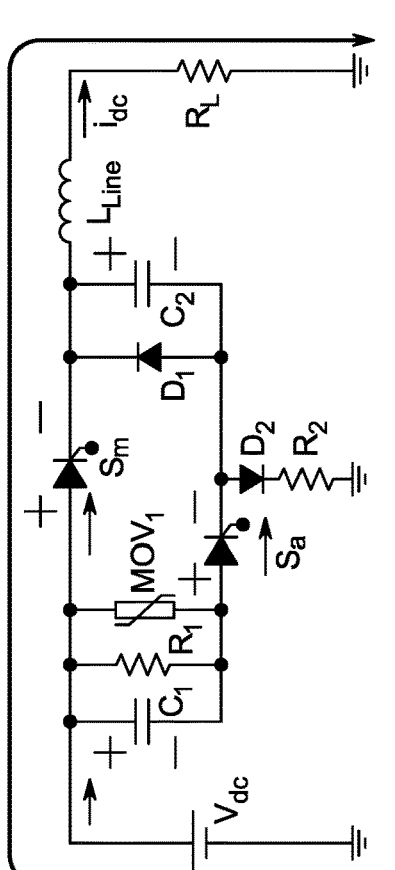
Figure 6B:
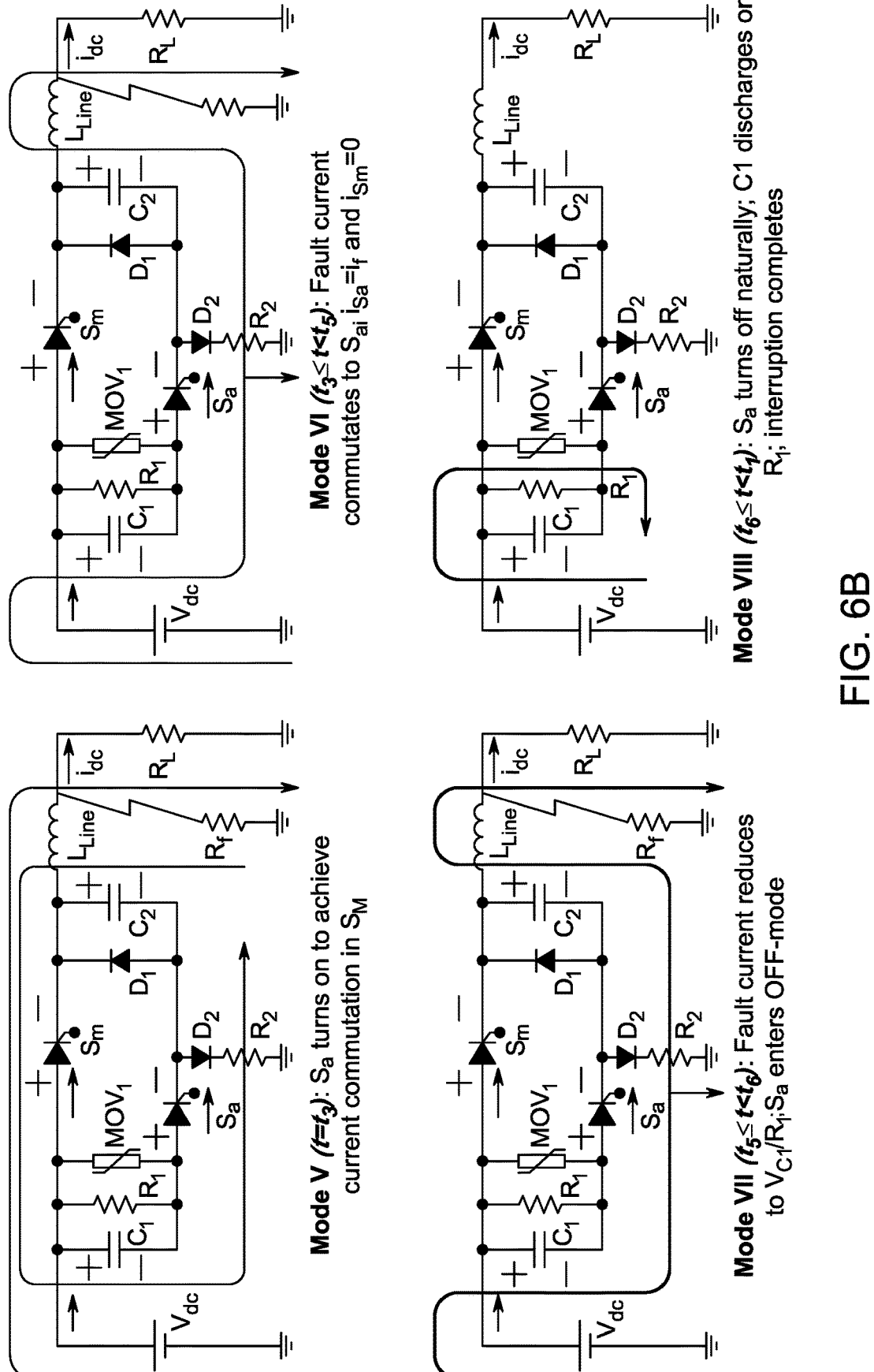

FIG. 5 indicates the reclosing process in both SSCBs. For YSSCB, capacitorC2 charges throughD2 and resistor R2. R2 helps to limit current oscillation in the system when Sm turns ON. Also, it reduces the current peak imposed on dc source during current interruption. R2 depends on Vdc and maximum fault current, but its value remains in the range of tens of Ω. Therefore, Y-SSCB is ready (C2 is charged) for rebreaking after a few milliseconds.

However, for SSCB in Shu, C1 charges through R1, where R1 has been predetermined by Sa turn-OFF process. In this case, the charging time of C1 is in the range of hundreds of milliseconds to a few seconds. In other words, after turning ON Sm (reclosing), SSCB in Shu cannot rebreak faults (as C1 is not charged) for a substantial interval and does not fulfill IEC-62271-100.

III. Proposed Y-SSCB: Working Principle and Design Procedure

A. Working Principle

Figure 7:
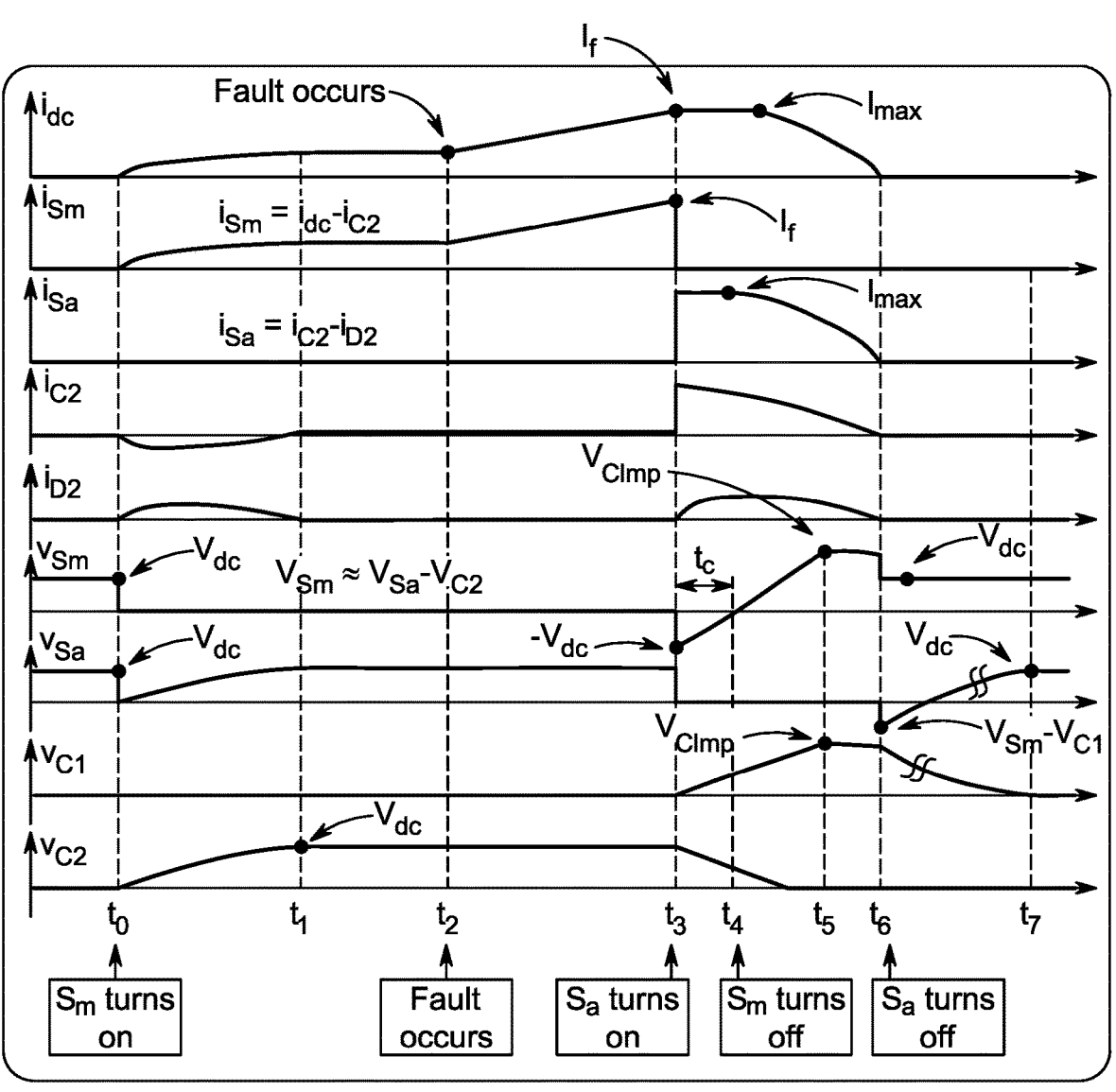
FIG. 7 shows critical current and voltage waveforms of the proposed Y-SSCB during a fault isolation.

FIG. 6 shows operating modes and FIG. 7 indicates the critical waveforms of the Y-SSCB during a short-circuit fault current interruption. A detailed explanation is given in the following.

Mode I (t<t0): SSCB is OFF, meaning both Sm and Sa are OFF and hold dc bus voltage Vdc individually (vSa=vSm=Vdc).

Voltage on passive components is zero, that is, vMOV1=vC1=vC2=0. Also, system and SSCB currents are zero, idc=iSm=iSa=iC2=iD2=0.

Mode II (t0≤t<t1): SSCB recloses the circuit by turning Sm ON. Load RL is energized. At the same time, C2 is charged through D2 and R2. Rebreaking is possible when C2 is charged.

So, the preparation time interval between a reclosing and the following rebreaking is determined by R2×C2 time constant.

Mode III (t1≤t<t2): C2 is fully charged, meaning vC2=Vdc. SSCB continues in normal operation mode. Sa remains OFF (vSa=Vdc and vC1=0). Current in Sa is zero (iSa=0), but the dc bus compensates C2 steady-state discharge, so vC2 remains at Vdc.

Mode IV (t2≤t<t3): Fault occurs at t=t2; dc current rises fast.

Mode V (t=t3): Fault current increases to If (iSm=idc=If). SSCB begins current interruption by turning Sa ON, which transfers the stored energy in C2 to C1 through Sm resulting in CC. The dynamic turn-OFF in Sm follows the same procedure elaborated in Section II-B.

Mode VI (t3<t<t5): Sm turns OFF; fault current commutates to Sa and charges C1; C2 discharges and its voltage decays to zero.

Mode VII (t5≤t<t6): MOV1 clamps the voltage across C1 and dissipates the remaining inductive energy. C2 is prevented to be reversely charged using an antiparalleled D1.

MOV1 absorbs the inductive energy of the line inductance, and the line current idc reduces to Vdc/R1 at t=t6. The voltage on MOV1 returns to the dc bus voltage, meaning that VMOV1=Vdc. As Sa is ON, there is a leakage current in the system as C1 discharges on R1, which is idc=iR1=iSa=Vdc/R1. As illustrated in Section III-B2, R1 is selected to satisfy (Vdc/R1)<IH, where IH is the holding current in Sa. As iSa<IH, Sa enters its turn-OFF mode.

Mode VIII (t6≤t≤t7): Sa turns OFF naturally at t=t6; C1 continues discharging on R1, and vSa increases simultaneously since vSa=vSm-vC1. At t=t7, vC1=0 and vSa=Vdc; interruption completes and the SSCB goes back to mode I. In this case, the breaker is ready for reclosing the circuit and energizing the load RL.

B. Design Procedure

With respect to FIGS. 3, 6, and 7, key parameters in Y-SSCB are capacitors C1 and C2, resistors R1 and R2, thyristors Sm and Sa, and diodes D1 and D2.

1) C1 and C2 Selection: C1 and C2 are selected so that Sm undergoes its complete forward blocking. To achieve this, two conditions need to be satisfied: 1) ism reduces to zero, and 2) vSm must be negative for t tcc. The former is easily obtained through the Sm-C1-Sa-C2 path. In practice, to limit the generated pulse current at the instance of turning ON Sa, a small resistor RS can be connected in series with C2. Regarding a maximum fault current If, RS should be lower than Vdc/If. The latter (vSm<0 during tcc) is achieved when $$vSm(t)=(vC1(t)+vSa+RS \cdot If-vC2(t))<0 \text{ for } t \geq tcc \qquad (EQ. 2)$$

The easy way to find an approximation of C1 and C2 to satisfy (EQ. 2) is assuming dc current as a constant (idc=If) during current interruption. However, as the fault current is fed from the source during current interruption (refer to Mode VI in FIG. 6) and to satisfy tcc>tq in the main thyristor Sm, a redundancy factor 2<α<4 is included to ensure a safe commutation in Sm. Assuming C1=C2, we have $$C1=C2=C>(2 \cdot \alpha \cdot If \cdot tq/Vdc) \qquad (EQ. 3)$$

2) R1 and R2 Selection: R1 is used to discharge C1 during mode VIII. A small value of R1 helps to accelerate the reclosing time interval treclosing, which is about 3×C1×R1. However, R1 needs to satisfy iSa<IH during mode VII. Equation (4) gathers these criteria as follows:

$$(Vdc/IH)<R1<(treclosing/(5 \cdot C)) \qquad (EQ. 4)$$

R2 determines C2 charging interval in mode II, which is the SSCB's preparation time trebreaking (≈3×C2×R2) for the next interruption. Also, it helps to reduce the peak current imposed on dc source during mode V. To limit the source current flowing through R2 at the time of turning ON Sa, R2 needs to satisfy the following equation:

$$R2>Vdc/(\rho \cdot If)) \qquad (EQ. 5)$$

where ρ is particularly defined as 10% in this article. By combining Equations (3) and (5), R2 is defined as follows:

$$(2 \cdot \alpha \cdot tq/(\rho \cdot C))<R2<(trebreaking/(5 \cdot C)) \qquad (EQ. 6)$$

3) Semiconductors Sm, Sa, D1, and D2 Selection: Regarding the working principle in Section III-A, voltage and current stresses on the active and passive components are listed in FIG. 17, Table I. In this case, solid-state switches Sm and Sa and diodes D1 and D2 are selected by satisfying the following equation:

$$\{VSm,break>VClmp \ \& \ VSa,break>Vdc$$

$$\{VD1,break>Vdc \ \& \ VD2,break>Vdc \qquad (EQ. 7)$$

where VSm,break, VSa,break, VD1,break, and VD2, break stand for the break-down voltage of Sm, Sa, D1, and D2, respectively; and VClmp is the maximum clamping voltage of MOV1.

As shown in FIG. 7, from t=t3 to t=t6, Sa handles the commutated fault current Time interval t6–t3 depends on the maximum fault current If, the dc bus voltage Vdc, the maximum clamping voltage of MOV1 labeled as VClmp, and the line inductor LLine. Sa needs to be selected in a way that it can safely conduct the fault current in this period. The same criteria are valid for D1 as it bypasses C2 when it completely discharges.

Figure 8:
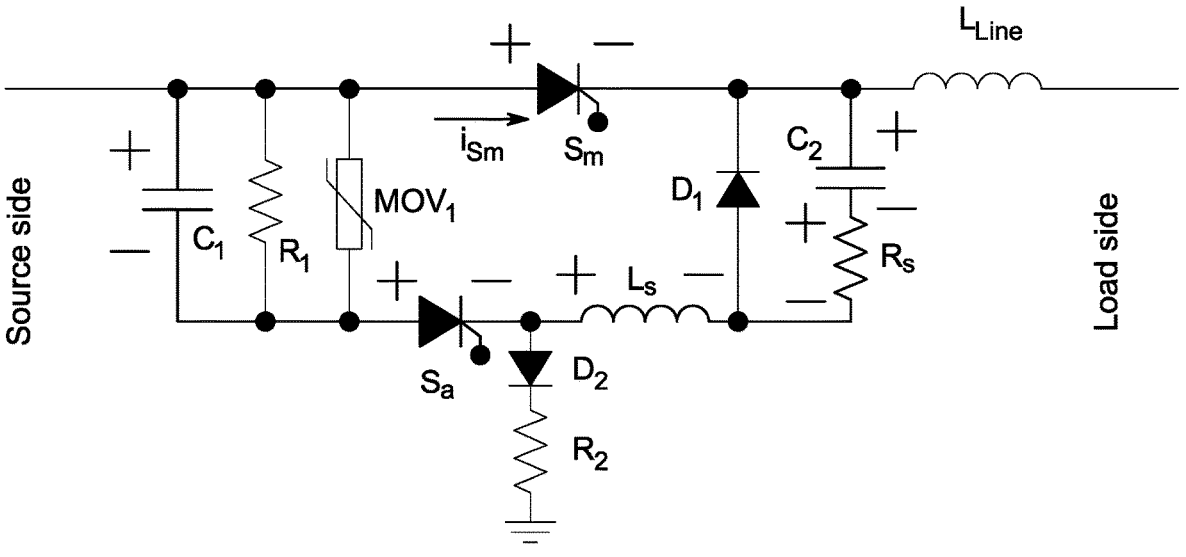
FIG. 8 shows a proposed Y-SSCB during reverse recovery process.

4) Current Derivative in Sm and Sa: Regarding FIG. 6 and mode V, FIG. 8 shows the reverse recovery process in Sm, where Ls and Rs are the loop inductance and resistance in C2-Sm-C1-Sa-Ls-Rs path. With respect to Eq. (2), by including the loop inductance Ls, the following equation is derived:

$$vSm=vC1+vSa+(Ls \cdot (diSa/dt))+(Rs \cdot iSa)-vC2 \qquad (EQ. 8)$$

By assuming vSa≈0 during the reverse recovery process, one can conclude Equation (9) as follows:

$$vSm \approx vC1+(Ls \cdot (diSa/dt))+(Rs \cdot iSa)-vC2 \qquad (EQ. 9)$$

which shows the impact of Ls and Rs on vSm. As vSm needs to be negative during tcc (referring to Section III-B1), higher values of Ls and Rs may lead to a failed forward blocking process in Sm. According to EQ. (9), Ls and Rs should be minimized.

On the other hand, a high current derivative in the commutation path (higher values of diSa/dt) results in a prompt temperature rise inside the device, creating internal hot spots, and finally permeant damage in the auxiliary thyristors. If the transient energy exceeds the devices' capability, an external inductance can be easily inserted into the commutation path.

In this case, EQ. (10) formulates the required Ls as follows:

$$Ls \geq (vSm+vC2-Rs \cdot iSa)/(diSa/dt)max \qquad (EQ. 10)$$

where (diSa/dt)max is the maximum allowable current derivative in Sa. Overdriving the gate (increasing the amplitude of the gate triggering pulse current with a fast-rising time, selecting thyristors with higher voltage/current ratings, and putting thyristors in parallel to handle higher pulse currents can significantly push up the current derivative limits in C2-Sm-C1-Sa-Ls-Rs commutation loop.

IV. Comparing the Proposed Y-SSCB to Shu's SSCB

To highlight the significance of the proposed Y-SSCB, it is compared with SSCB in Shu in terms of three practical factors.

A. Quantitative Comparison

Figure 9:
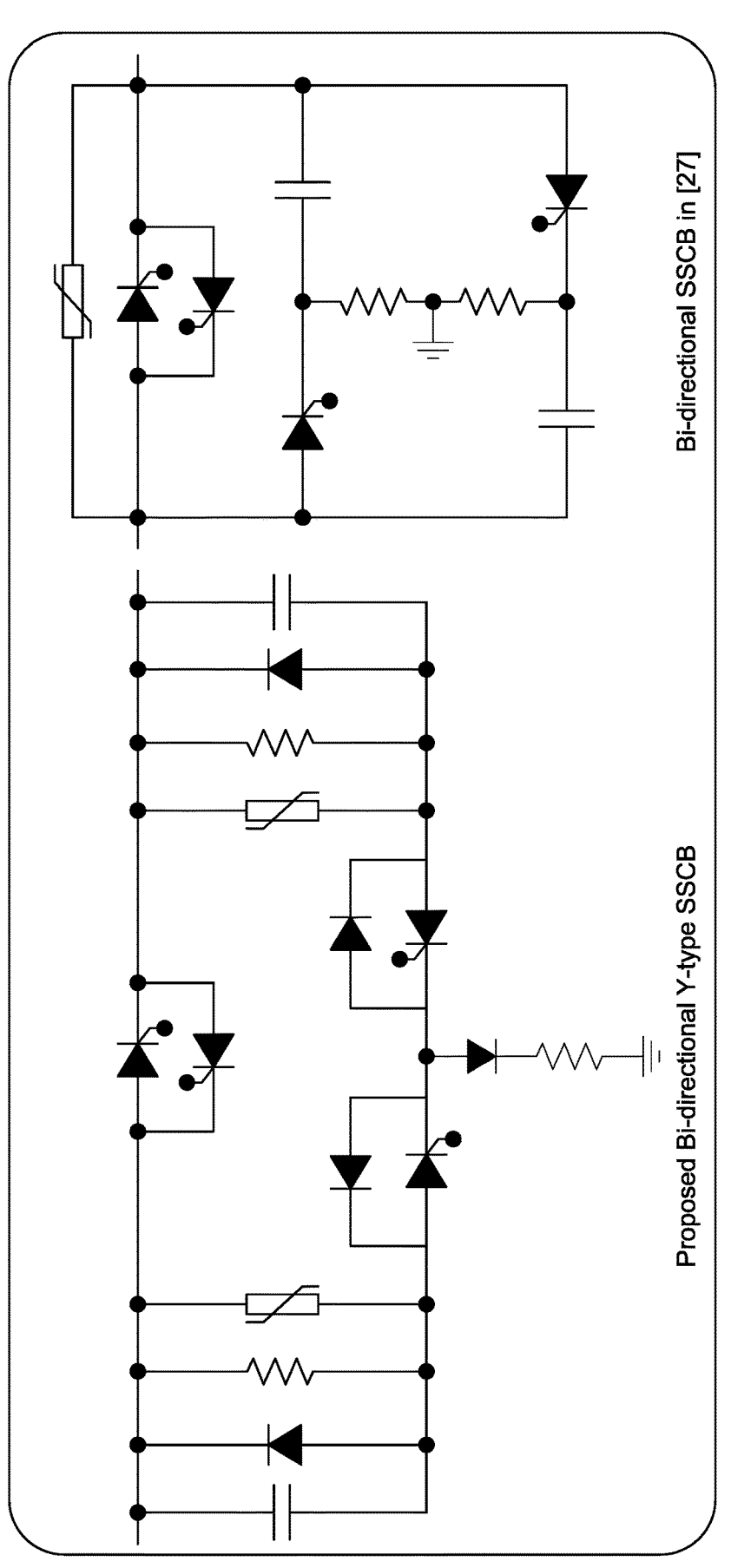
FIG. 9 shows bidirectional topologies: proposed Y-SSCB (left) and SSCB in Shu (right).

Bidirectional topologies are shown in FIG. 9. In this case, FIG. 18, Table II presents a comparison with the breaker in Shu in terms of the number of active and passive components. Considering the unidirectional topologies, the proposed Y-SSCB needs one more capacitor, one more resistor, and two more diodes. Also, regarding the bidirectional topologies, the proposed Y-SSCB needs one more resistor, one more MOV, and five more diodes.

However, the number of thyristors is the same for both SSCBs, which dominates the cost. Also, the capacitor used in Shu needs to be bipolar since its polarity is reversed during the dc current interruption.

B. Reclosing and Rebreaking Process

The proposed Y-SSCB presents a reliable reclosing process. As elaborated in Section II-C, the preparation time interval between the reclosing and the subsequent rebreaking in the SSCB in Shu is unsatisfactorily elongated.

For the proposed Y-SSCB, the preparation time between a reclosing and the subsequent rebreaking is defined as follows:

$$t_{rebreaking} = 6 \cdot \alpha \cdot t_q / \rho \text{ for } Y\text{-SSCB} \tag{EQ. 11}$$

where $t_{rebreaking}$ ensures 95% charge in C2 after reclosing. Also, the preparation time interval for SSCB in Shu is given in EQ. (9)

$$t_{rebreaking} = 3 \cdot \alpha \cdot t_q \text{ } I_f / I_H \text{ for SSCB in } Shu \tag{EQ. 12}$$

Regarding Equations (11) and (12), Equation (13) shows the preparation time ratio where thyristors turn-OFF time tq and redundancy factor $\alpha$ are the same for both breakers, and $\rho = 0.1$ $$k - \frac{(\text{preparation time in Shu})}{(\text{preparation time in } Y - SSCB)} = \frac{(EQ.12)}{EQ.11} = I_f / (20 \times I_H) \tag{Eq. 13}$$

Regarding Equation (13), k increases when IH decreases or If rises. For example, given IH=200 mA and If=120 A, k is 30. That is, after reclosing, the proposed Y-SSCB is ready for rebreaking and isolating short-circuit faults 30 times faster than SSCB in Shu.

C. MOV Degradation Issue and Main Switch Voltage Utilizations Rate

The proposed Y-SSCB offers higher reliability and an enhanced voltage utilization rate in the main switch. With respect to FIG. 3, the SSCB in Shu imposes Vdc on the MOV when the breaker is OFF. This brings reliability issues due to the MOV degradation explained below.

As the number and duration of surge currents in MOVs rise, the MOVs fall into degradation. As MOVs degrade, the leakage current increases and the time to failure decreases. In addition, the MOVs leakage current value is directly proportional to the temperature, meaning that higher temperatures increase the leakage current in MOVs. A thermal runaway happens in an MOV when its temperature goes beyond its capability, resulting in a short-circuit failure.

To solve MOV degradation in SSCBs, a 20% margin in selecting the MOV dc rating VMOV,rating (the maximum allowable dc voltage on MOV in steady-state) has been suggested by Rodrigues et al., meaning Vdc≤0.8×VMOV, rating. However, it brings dimensioning issues and most importantly reduces the voltage utilization rate of the main thyristor. Regarding the research reported by others, the voltage utilization rate ηv in a solid-state switch is defined as follows:

$$\eta v = (Vdc / \text{main switch voltge rating}) \times 100\%. \tag{EQ. 14}$$

Considering Equation (14), to avoid MOV degradation, Vdc is limited to 0.8×VMOV,rating, which consequently reduces ηv. As ηv decreases, more solid-state switches need to be connected in series, leading to a more complicated and expensive design.

The proposed Y-SSCB solves the MOV degradation safety issue by disconnecting the MOV from the power line when SSCB is OFF. This fact is clear in FIG. 7, where vMOV1=vC1. The presented advantage extends the maximum allowable dc bus voltage on SSCB, which is highly attractive for industrial applications. Compared with the SSCB in Shu, the proposedY-SSCB presents at least 20% increase in ηv, which is significant.

It can be concluded that both Y-SSCB and the SSCB in Shu have almost similar design costs, but the proposed Y-SSCB presents better performance and higher practicality.

V. Experimental Validation

Figure 10:
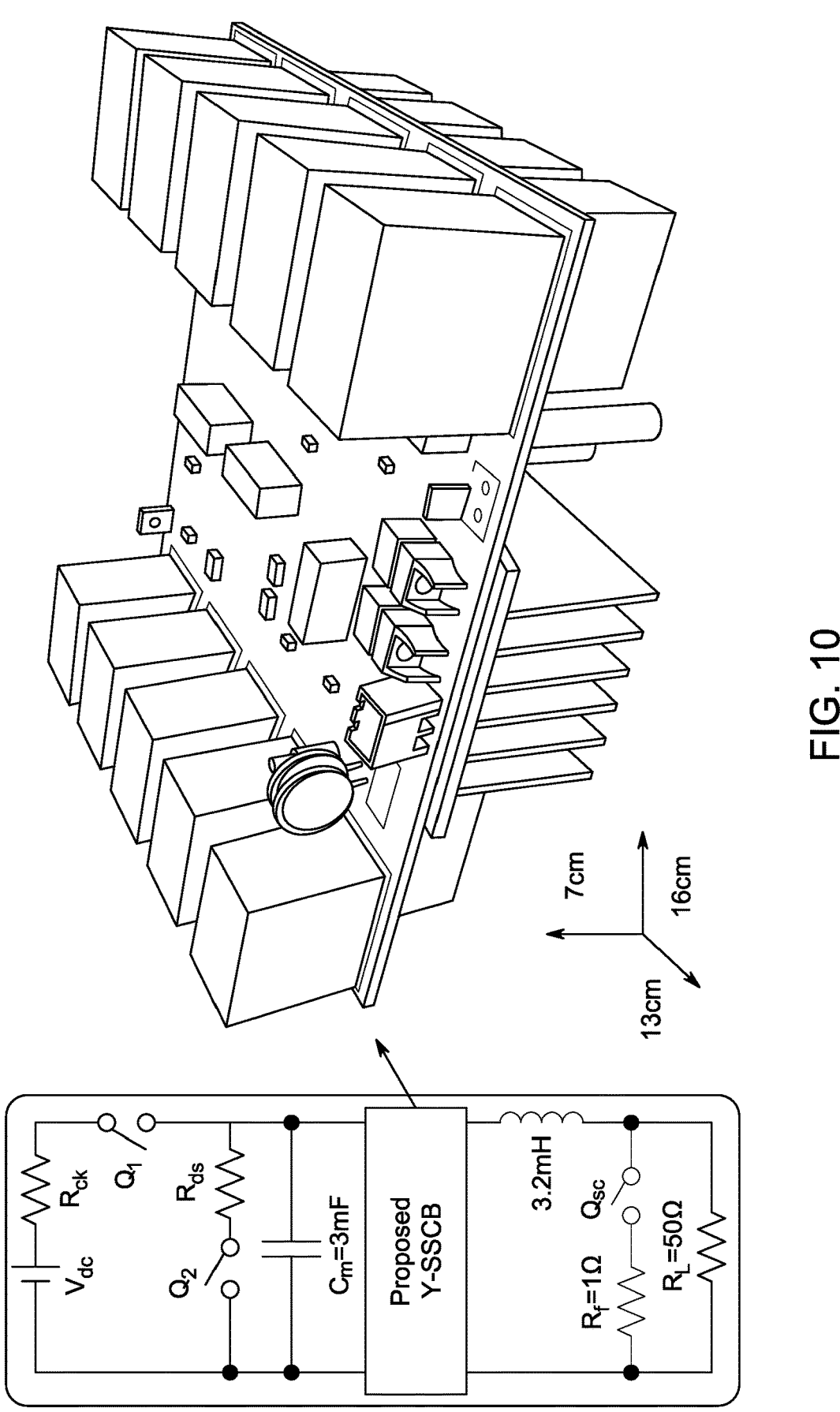
FIG. 10 shows a 400 V/120 A Y-SSCB prototype and the dc test circuits diagram.

To verify the proposed Y-SSCB, experiments are conducted. FIG. 10 shows the implemented 400 V/120 A SSCB prototype and the dc test circuit diagram. The corresponding parameters are listed in FIG. 19, Table III. A 3 mF dc-link capacitor Cin is used to obtain a pulse current capability. Also, to limit the fault current's rising rate during experiments and obtain a fair comparison with the breakers in Shu and others, a 3.2 mH line inductor has been used in the dc test circuits. To emulate a short-circuit fault, a solid-state switch QSC is connected in series with a 1Ω fault resistor. At the load side, a 50Ω resistor is used to achieve 8 A steady-state load current, whereas the SSCB can conduct 12 A continuous load current under the current interruption capability of If=120 A.

For thyristors Sm and Sa, SK655KD is selected, which presents a holding current of IH=200 mA with the thyristor turn-OFF time of tq=20 μs. Takenα=3.75 and ρ=10%,C1 and C2 are chosen as 45 μF using EQ. (3). The redundancy factor of 3.75 obtains safety during tests and satisfies the criteria mentioned in Section III-B1. Besides, R1 is selected as 2.5 kΩ considering EQ. (4), and R2 is chosen as 50Ω using EQ. (6). For Rs, three 1Ω resistors are connected in parallel to achieve 0.33Ω. To highlight the effectiveness of the proposed Y-SSCB, experimental results of fault current interruption, operation of the main switch Sm, operation of the auxiliary switch Sa, and operation of Y-SSCB under reclosing and rebreaking are separately illustrated in the following sections.

A. Short-Circuit Fault Current Interruption

Figure 11:
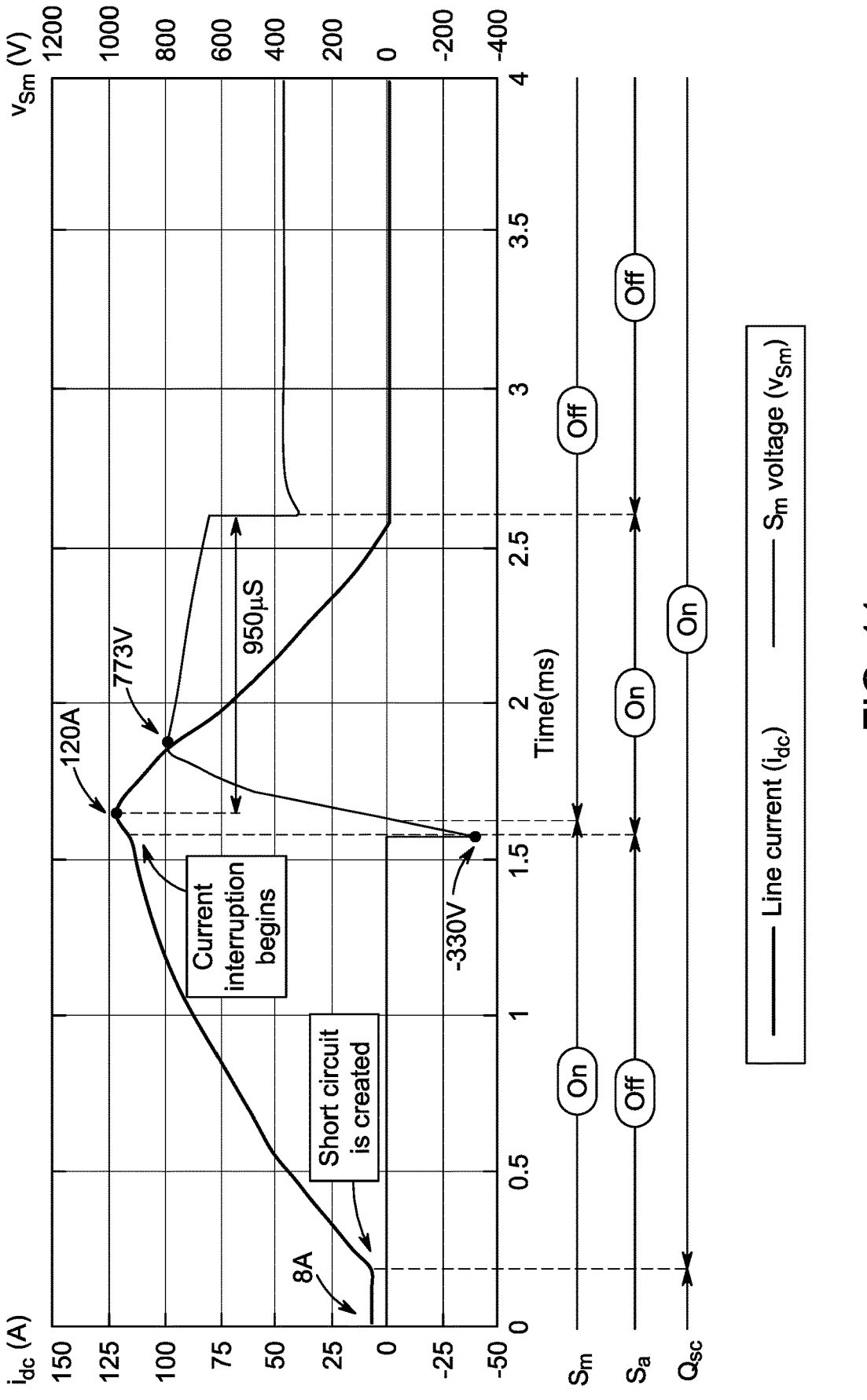
FIG. 11 shows experimental results: line current (idc) and voltage across Sm (vSm). SSCB conducts 8 A load current in a steady state; a short circuit is created at t=0.175 ms; fault current interruption begins at t=1.57 ms; dc current begins to decay at t=1.65 ms and reaches zero at t=2.6 ms.

Short-circuit current interruption is shown in FIG. 11. The status of the solid-state switches Sm, Sa and the fault switch QSC is also represented in FIG. 11 to clarify the controlled time sequence used in conducting the experiments.

The SSCB conducts 8 A load current in a steady state. A short circuit is emulated in the system by turning QSC on at t=0.175 ms; then, the fault current begins to increase in the system. At t=1.57 ms, the fault current reaches 115.2 A, where the resistance of the line inductor also contributes to limiting the fault current. Then, SSCB starts breaking the dc current by turning ON Sa. After tcc=57.7 μs, the voltage across Sm returns to zero and begins blocking the forward voltage. The Sm turn-OFF process is elaborated in Section V-B. At t=1.65 ms, vSm exceeds Vdc and forces the line current in the system to zero, where the line current peak reaches 120 A. Therefore, the reaction time interval is 80 µs (=1.65-1.57 ms). The line current reduces to zero at t=2.6 ms; current interruption process completes when Sa turns OFF naturally and holds vSa=vSm−VC1. As FIG. 11 indicates, Sm experiences the undershoot voltage of negative 330 V and peak voltage of 773 V.

B. Operation of Main Thyristor Sm

Figure 12:
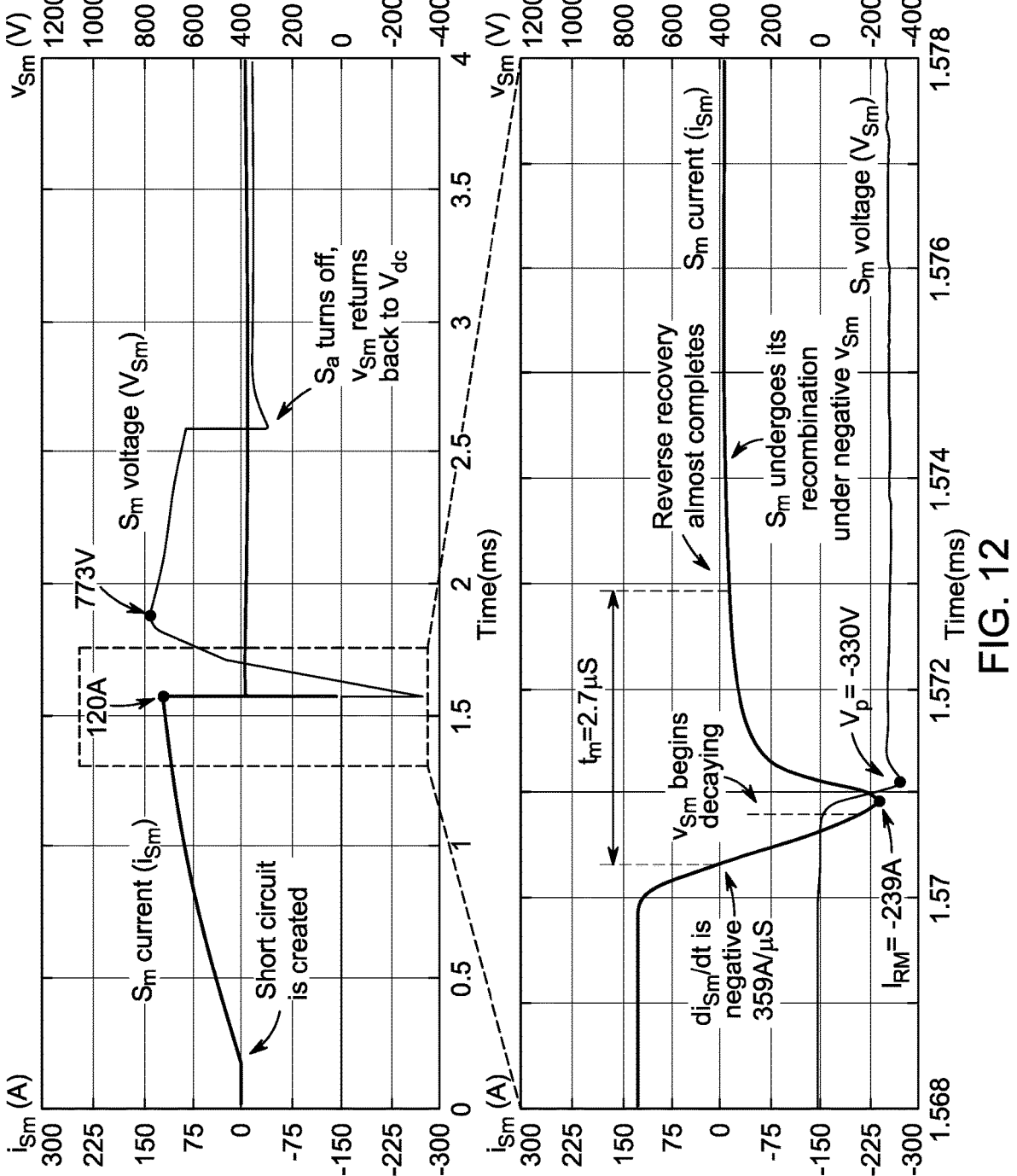
FIG. 12 shows experimental results: Sm current iSm and voltage vSm during dc current interruption. Results are consistent with the analysis in Section II-B and FIG. 3.

The operation of thyristor Sm during current interruption is explained in this section. FIG. 12 shows the voltage and current in Sm and FIG. 13 indicates voltage across Sm, C1, and C2.

As shown in FIG. 12, current commutation in Sm is achieved at t=1.57 ms, where its current reduces from 120 A to negative 239 A within 1 µs. The shape of the Sm current and voltage during the turn-OFF dynamic follows the analysis of Section II-B, where the thyristor reverse recovery interval trr is estimated as 2.7 µs. The conducted pulse current in Sm is totally safe as the selected thyristor SK655KD is able to handle 550 A for 20 ms. Besides, with respect to FIG. 13, the voltage across Sm is negative for tcc=57.7 is, which is sufficient for Sm to undergo its forward blocking process successfully.

Figure 13:
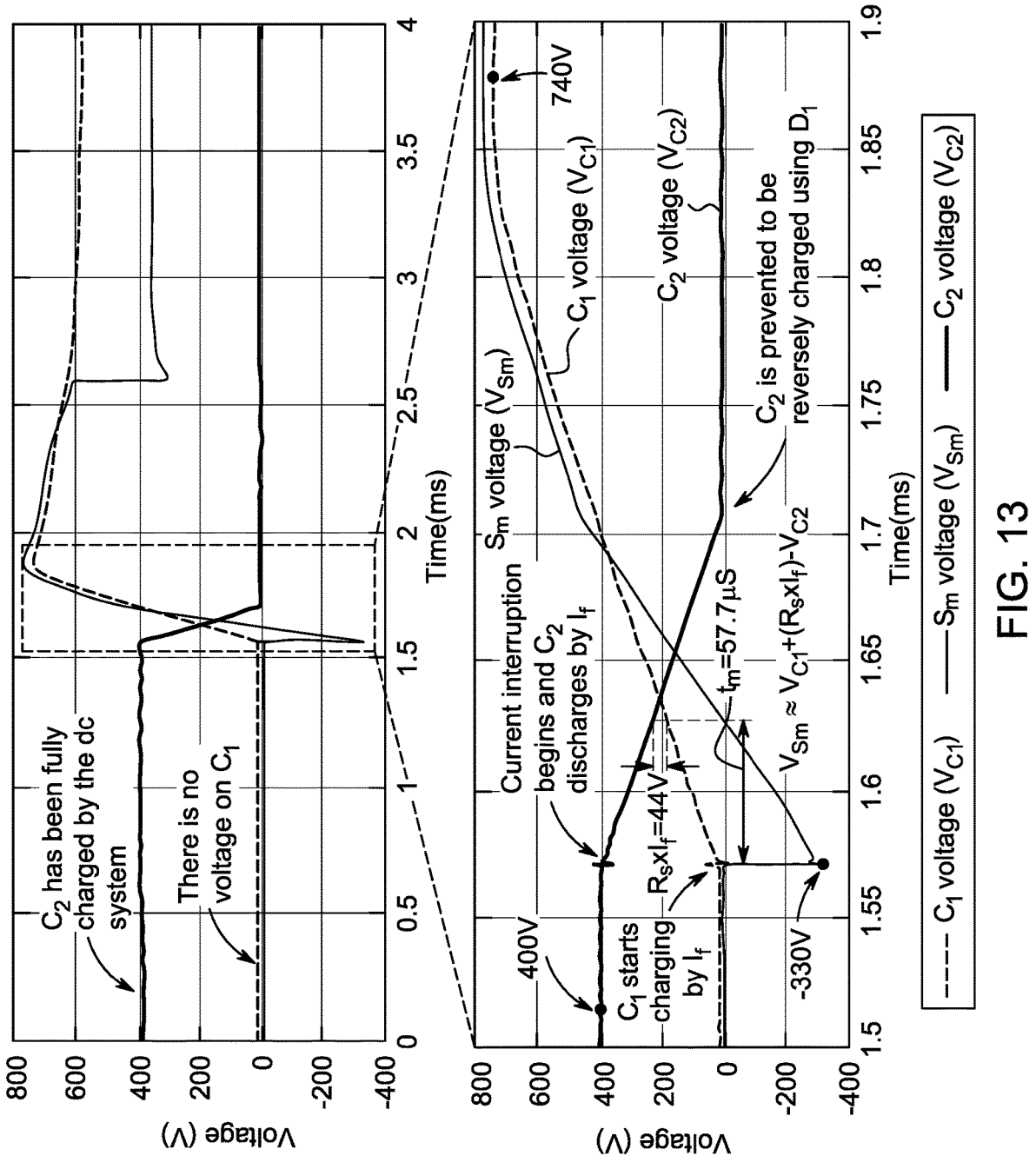
FIG. 13 shows experimental results: the voltages across Sm, C1, and C2 are shown. Sm voltage follows vSm=vC1+

Furthermore, FIG. 13 indicates the operation of C1 and C2 during current interruption, where the following points can be concluded.

1) Voltage on C1 is zero before the short circuit occurs in the system. As MOV1 and R1 are connected in parallel to C1, the voltage on MOV1 and R1 is also zero. By turning Sa on at t=1.57 ms, the voltage on C1 begins to increase, and it is clamped to 740 V under the operation of MOV1.

2) Voltage on C2 has been charged to 400 V during steadystate operation, which again confirms the analysis of Section III. As Sa turns ON, the voltage on C2 begins decaying by the fault current and it reaches zero at t=1.71 ms. Due to the operation of diode D1 in parallel to C2, the voltage on C2 remains zero, and it is not allowed to be charged reversely. This feature obtains the possibility to use unipolar capacitors in Y-SSCB.

3) Regarding the Sm voltage in FIGS. 13 and (2), vSm≈vC1+(Rs×If)−vC2. In this case, when vSm≈0, Rs×If=vC2−vC1. This voltage has been recorded as 44 V in FIG. 13, which results in Rs=0.36Ω for If=120 A.

The calculated Rs is close to the expected value of 0.33Ω according to Table III, where the drop voltage across Sa and the parasitic resistance in the loop of Sm-C1-Sa-Rs-C2 stand for the difference.

C. Operation of Auxiliary Thyristor Sa

The current and voltage waveforms of the auxiliary thyristor Sa are shown in FIGS. 14 and 15, respectively. During the steady-state and before the current interruption process, Sa is OFF, meaning vSa=400 V and iSa=iC1=0.

Sa turns ON at t=1.57 ms to achieve commutation in Sm. Voltage on Sa reduces to zero, and its current undergoes an overshoot as shown in FIG. 14. The peak of Sa current reaches 365 A within 1 µs, and it goes back to iSa=If=120 A within 3 µs. The current peak and its duration have safe margins with limitations of the selected thyristor SK655KD. The current peak in Sa during current commutation depends on the circuit (parasitic elements), electrical ratings of the dc system, and features of selected thyristors as described in (1). As the current in Sa reduces below its holding current at t=2.6 ms, Sa turns OFF naturally and holds vSa=vSm−vC1.

As shown in FIG. 15, vSa experiences a negative peak voltage of 298 V, and it begins to return back to Vdc=400 V as vC1 discharges on R1.

D. Operation of the Proposed Y-SSCB Under Reclosing and Rebreaking

Regarding the analysis presented in Section III, the proposed Y-SSCB can reclose the circuit and energize the load when C1 is almost discharged by paralleled resistor R1. With respect to FIG. 19, Table III, R1=2.5 kΩ and C1=45 µF. Regarding the reclosing time interval, C1 discharges by 95% in 337.5 ms(3×R1×C1) and by 98% in 450 ms (=4×R1×C1). The preparation time interval in the proposed Y-SSCB relies on resistor R2 and capacitor C2.

Given the value of R2=50Ω and C2=45 µF, after turning Sm ON, C2 charges to 0.95×Vdc in 6.75 ms (=3×R2×C2) and 0.98×Vdc in 9 ms (=4×R2×C2).

The lower limits of reclosing and the preparation time intervals are determined by parameters C1, C2, R1, and R2. The C1 and C2 selections depend on the maximum fault current. If aimed to be interrupted in the system, the dc bus voltage Vdc, and the thyristor specifications. The reclosing and the preparation time intervals are shorter for smaller If, faster thyristor (smaller tq), and larger IH. It is noted that, according to the maximum fault current If=120 A, the dc bus voltage Vdc=400 V, the thyristor turn-OFF time tq=20 µs, and IH=200 mA, parameters C1, C2, R1, and R2 have been selected to minimize the reclosing and preparation time intervals.

FIG. 16 indicates the experimental results under reclosing and rebreaking process, where the test has been repeated 10 times in the periods of 500 ms. As FIG. 16 shows, the proposed Y-SSCB is able to perform the operating duty of reclosing and rebreaking successfully and satisfies IEC-62271-100.

FIG. 20, Table IV presents a comparison between the proposed YSSCB and the active commutation-based breakers in the literature. To have a fair comparison, the maximum fault current is considered as 120 A, the dc bus voltage is Vdc=400 V, the thyristors' turn-OFF time and the holding current are assumed as tq=20 µs and IH=200 mA, respectively, and the redundancy factor is α=3.75. The proposed Y-SSCB has a longer reclosing time compared with the topologies listed in FIG. 20, Table IV. This issue elongates the re-energizing stage and puts limitations on the protective functions in dc systems. Solutions to this problem can be investigated in future research works. The proposed Y-SSCB presents a faster preparation time compared with the SSCBs Shu and others. S E. Efficiency of the Proposed Y-SSCB The short-circuit capability of an SSCB is given as 10 times the nominal load current. As the effectiveness of the proposed Y-SSCB under If=120 A has been verified, the proposed Y-SSCB is designed to conduct 12 A load current in steady-state. According to the manufacturer information for the main thyristor Sm, the conduction power loss of SK655KD is below 10 W under Idc=12 A. In this case, the proposed Y-SSCB presents the efficiency in (15) during steady-state operation.

$$\eta Y\text{-SSCB} \geq (1-(PY\text{-SSCB})/(Vdc \times Idc)) \times 100\% = 99.79\%. \tag{EQ. 15}$$

It is noted that the line inductor is not included in calculating efficiency as it is a part of the dc system under operation.

VI. Comparative Study

Experimental results verify the analysis presented in Sections II-IV and prove the effectiveness of the proposed YSSCB. To highlight the significance of the presented Y-SSCB in practice, a comparative study with the reported topologies in literature has been conducted, and the results are summarized in FIG. 21, Table V. The presented comparison is based on the unidirectional topologies.

Compared with the CC-based breakers in Shu, the proposed Y-SSCB presents a safe reclosing. It also solves the MOV degradation reliability issue when SSCB is OFF. Also, the voltage utilization rate in the proposed Y-SSCB is higher, which reduces the cost when multiple solid-state switches need to be connected in series. However, that the source feeds the fault after turning OFF the main switch is one of the practical issues of CC-based SSCBs. This problem also exists in LCS-based structures and imposes a burden on the source during dc current interruption.

Future works can focus on solving this issue in CC-based and LCS-based SSCBs.

Compared with the AR-based SSCBs, the proposed Y-SSCB presents a relatively lower number of thyristors, faster current commutation, and higher short-circuit current interruption capability. As there is no inductor in the main conduction branch (in series with Sm), Y-SSCB presents a higher power density and an improved compactness.

LCS-based SSCBs have a lower number of thyristors and faster reclosing and rebreaking process compared with the proposed Y-SSCB. However, high current interruption capability is hard to achieve in these topologies due to the series connected IGBTs in the main branch. IGBTs also reduce the efficiency of the final design. MOV degradation reliability issue is another concern in LCS-based SSCBs.

Passive communication topologies may take the advantage of autonomous fault isolation, which is highly significant. On the other hand, the application of these SSCBs is limited as there is no manual tripping in the original structures. Also, they present relatively lower current interruption capability compared with the proposed Y-SSCB.

VII. Conclusion

A new Y-type thyristor-based dc SSCB has been described. The significances of the presented SSCB are summarized as follows.

1) Obtained commutation path is capacitive, leading to a fast current commutation in the main thyristor.
2) The proposed breaker protects the dc system during short circuit and overload scenarios, which enhances the practicality of newly introduced system-level protections.
3) Benefiting from a high short-circuit capability of thyristor devices and full control switches in the main branch, high current interruption capability is obtained.
4) MOVs are disconnected from the power line during SSCB OFF-state, which addresses the MOV degradation reliability issue. Also, it obtains the possibility to extend the maximum allowable dc bus voltage on the breaker by increasing the main switch voltage utilization rate.

5) A complete design procedure was presented to optimize passive and active components.
6) The proposed SSCB can perform the operating duty of reclosing and rebreaking process successfully. Experiments of 400 V/120 A in isolating short-circuit fault conditions validate the effectiveness of the proposed Y-SSCB in practice.

While the invention has been described with reference to the embodiments above, a person of ordinary skill in the art would understand that various changes or modifications may be made thereto without departing from the scope of the claims.

We claim:

1. A Y-Type Thyristor-Based DC solid state circuit breaker (Y-SSCB) comprising:
   a first capacitor;
   a first resistor; and
   a metal oxide varistor;
   wherein the first capacitor, first resistor, and metal oxide varistor are in parallel;
   a main thyristor and an auxiliary thyristor, wherein the metal oxide varistor is connected to an anode of the main thyristor and auxiliary thyristor;
   a first diode and second capacitor in parallel with one another and connected to a cathode of the main thyristor and auxiliary thyristor;
   a second diode connected to a cathode of the auxiliary thyristor; and
   a second resistor in series with the second diode and directly connected to the auxiliary thyristor, wherein the first capacitor turns off the auxiliary thyristor and the second resistor does not contribute to turning off the auxillary thyristor.

2. The Y-SSCB of claim 1, wherein a DC voltage is connected to the first capacitor, first resistor, and metal oxide varistor.

3. The Y-SSCB of claim 2, wherein a line conductor and line resistor in series are connected in series to the first diode and second capacitor.

4. The Y-SSCB of claim 1, wherein the second capacitor is charged by a DC voltage and obtains complementary commutation in the main thyristor during DC current interruption.

5. The Y-SSCB of claim 4, wherein the first capacitor achieves a turn-OFF in the auxiliary thyristor.

6. The Y-SSCB of claim 1, wherein the second capacitor charges through the second diode and second resistor.

7. The Y-SSCB of claim 6, wherein the second resistor limits oscillation within the Y-SSCB when the main thyristor turns on.

8. The Y-SSCB of claim 7, wherein second resistor reduces current peak imposed on a DC source during current interruption.

9. The Y-SSCB of claim 8, wherein the second resistor has a resistance in the tens of ohms.

* * * * *